United States Patent [19]
Waters

[11] Patent Number: 5,410,499
[45] Date of Patent: Apr. 25, 1995

[54] PHASE SHIFTER FOR DIRECTLY SAMPLED BANDPASS SIGNALS

[75] Inventor: William M. Waters, Millersville, Md.

[73] Assignee: The United States of America as represented by the Secretary of the Navy, Washington, D.C.

[21] Appl. No.: 220,718

[22] Filed: Mar. 31, 1994

[51] Int. Cl.⁶ ........................ G06F 15/31; G06G 7/02
[52] U.S. Cl. .............................. 364/724.01; 364/825
[58] Field of Search ...................... 364/724.01, 724.16, 364/825, 807

[56] References Cited

U.S. PATENT DOCUMENTS

| | | | |
|---|---|---|---|
| 4,468,794 | 8/1984 | Waters et al. | 375/103 |
| 5,140,613 | 8/1992 | Birgenheier et al. | 364/724.04 |
| 5,142,553 | 8/1992 | Rosenkranz | 375/75 |
| 5,325,204 | 6/1994 | Scarpa | 364/724.17 |

*Primary Examiner*—Tan V. Mai
*Attorney, Agent, or Firm*—Thomas E. McDonnell; George Jameson

[57] ABSTRACT

A phase shifter for shifting the phase of directly sampled bandpass signals without having to convert to complex (I,Q) form is disclosed. An application requiring a plurality of appropriately phase shifted signals is a phased array antenna. In the operation of an exemplary phase shifter, a sequence of directly sampled data is passed into an exemplary three-stage storage unit to sequentially store $r_{n+1}$, $r_n$ and $r_{n-1}$ data samples. The $r_n$ sample is multiplied by $\cos \phi$ to develop an $r_n \cos \phi$ signal, where $\phi$ is the desired phase shift angle. At the same time, the $r_{n+1}$ and $r_{n-1}$ data samples are subtracted from each other and the result is multiplied by $w_1 \sin \phi$ to develop the value $w_1(r_{n+1} - r_{n-1}) \sin \phi$. This value is added to $r_n \cos \phi$ to produce an estimated sample value $\hat{r}_n'$, which is approximately equivalent to data directly sampled from a signal phase-shifted by $\phi$.

8 Claims, 6 Drawing Sheets

PHASE SHIFTER FOR DIRECTLY SAMPLED BANDPASS SIGNALS

BACKGROUND OF THE INVENTION

1. Field of the Invention

The present invention relates to phase shifters and particularly to a phase shifter for shifting the phase of directly sampled bandpass signals without having to convert to complex (I,Q) form.

2. Description of Related Art

In direct sampling phase shift processing, a sequence of values, $r_n$, is sampled directly from a signal r(t), assuming that all requirements of direct sampling are met. Consider $r_n'$ to be direct samples from r' (t), where r' is identical to r, except for a phase shift $\phi$.

To shift the phase of a directly sampled signal sequence, an appropriate alteration of the sequence must be performed so that the new sequence approximates direct samples from the phase shifted signal.

Several known direct sampling phase shift processing (SOA) techniques for obtaining $r_n'$ from $r_n$ are discussed below.

1) A first technique for obtaining $r_n'$ from $r_n$ is to utilize an analog phase shifter before an analog-to-digit (A/D) converter. The analog phase shifter provides r' (t) from r(t). Thus, values sampled by the A/D converter from r' (t) are the $r_n'$ by definition.

This first technique requires an analog phase shifter and an additional A/D converter in a separate channel to provide $r_n'$. Analog phase shifters require biased ferrites, switched transmission lines, or heterodyning with a phase shifted local oscillator. Each one of these additional components is considerably larger, more costly, and less accurate than applicant's invention described in this application.

2) A second technique for obtaining $r_n'$ from $r_n$ would be to sample In and Qn from the in-phase, I(t), and quadrature, Q(t), components of the signal r(t), respectively, and to compute the $r_n'$ from the $r_n$ by complex multiplication.

This second technique requires I and Q demodulators and A/D converters for each demodulator. It also requires the necessary storage, multiplications, and addition required to compute $r_n'$ from In, Qn and $\phi$. Applicant's invention requires no I and Q demodulators (and hence is fundamentally more accurate), only one A/D converter, and about the same digital hardware.

3) A third technique for obtaining $r_n'$ from $r_n$ would involve computing In and Qn from the $r_n$ according to a process described in U.S. Pat. No. 4,468,794 and again performing the phase shift computation by complex multiplication.

In the third technique, the In and Qn values computed from $r_n$ values require a (2k+1)-stage shift register, k multiplications, k additions, and 2 single-pole, 4-throw digital switches in addition to circuits for computing the $r_n'$ from the In, Qn and $\phi$. This is more accurate than the second technique, but requires about twice as much digital hardware to obtain In and Qn as that required to compute $r_n'$ directly from $r_n$ using applicant's invention.

SUMMARY OF THE INVENTION

It is therefore an object of the invention to shift the phase of directly sampled bandpass signals.

Another object of the invention is to provide a phase shift system for shifting the phase of directly sampled bandpass signals without having to convert to a complex (I,Q) form.

Another object of the invention is to provide a phase shift system for controlling the phase of a reference signal in a coherent receiver or modulator.

A further object of the invention is to provide a phase shifter system for shifting the phase of directly sampled bandpass signals without having to convert to a complex (I,Q) form.

These and other objects of this invention are achieved by providing a digital filter for shifting the phase of directly sampled bandpass signals without having to convert to complex (IQ) form. An application requiring a plurality of appropriately phase shifted signals is a phased array antenna. In the operation of the digital filter, a sequence of directly sampled digital data is passed into an exemplary three-stage shift register to sequentially store $r_{n+1}$, $r_n$ and $r_{n-1}$ data samples. The $r_n$ sample is multiplied by cos $\phi$ to develop an $r_n$ cos $\phi$ signal, where $\phi$ is the desired phase shift angle. At the same time, the $r_{n+1}$ and $r_{n-1}$ data samples are subtracted from each other and the result is multiplied by $w_1 \sin \phi$ to develop the value $w_1(r_{n+1}-r_{n-1})\sin \phi$. This value is added to $r_n \cos \phi$ to produce an estimated sample value, $\hat{r}_n'$, which is approximately equivalent to data directly sampled from a signal phase-shifted by $\phi$.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding/parts throughout the several views and wherein.

DETAILED DESCRIPTION OF THE PREFERRED EMBODIMENTS

Figure 1:
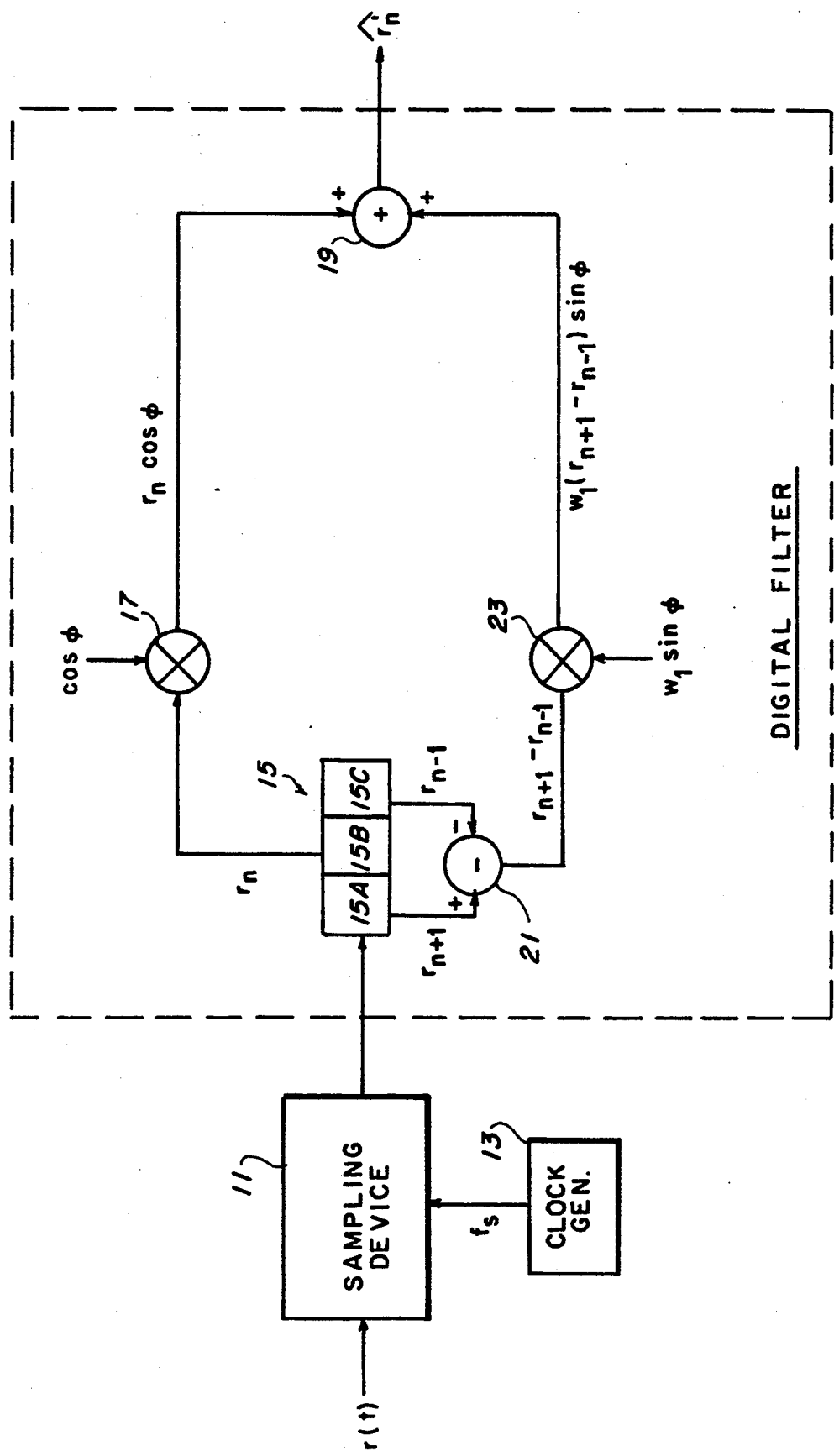
FIG. 1 illustrates a first embodiment of the invention, where k=1.

Referring now to the drawings, FIG. 1 illustrates a first embodiment of the phase shifter of the invention. More specifically, the phase shifter of FIG. 1 shifts the phase of directly sampled bandpass signals without having to convert to the complex (I,Q) form.

In FIG. 1, r(t) is a bandpass signal, such as an exemplary 30 MHz IF frequency, received from a receiver (not shown) that might be coupled to an antenna (not shown). This bandpass signal r(t) is sampled by a sampling device 11, such as an A/D converter, at times determined by sampling pulses or clocks $f_s$ of a clock generator 13 in order to produce a sequence of $r_{n+1}$ sample values.

A three stage shift register 15 sequentially stores the sample values as they are produced by the sampling device 11. Thus, at each clock time $f_s$, the shift register 15 respectively stores the current sample values of $r_{n+1}$, $r_n$ and $r_{n-1}$ in stages 15A, 15B and 15C of the register 15. All three of the values of $r_{n+1}$, $r_n$, and $r_{n-1}$ are needed to form the output estimated phase shifted sampled data $\hat{r}_n{}'$ which will now be discussed.

The $r_n$ value in stage 15B of the register 15 is multiplied by $\cos \phi$ in a multiplier 17 to develop the product value of $r_n \cos \phi$, which is applied to one input of an adder or combiner 19. The $r_{n-1}$ value in stage 15C of the register 15 is subtracted in a subtractor 21 or combiner from the $r_{n+1}$ value in stage 15A of the register 15 to develop the difference value $r_{n+1} - r_{n-1}$. This difference value $r_{n+1} - r_{n-1}$ is multiplied in a multiplier 23 by $w_1 \sin \phi$ to develop the product signal $w_1(r_{n+1} - r_{n-1})\sin \phi$ which, in turn, is added in the adder 19 to the $r_n \cos \phi$ output from the multiplier 17 to produce an estimated, phase shifted, sample value $\hat{r}_n{}'$. This estimated, phase shifted, sample value $\hat{r}_n{}'$ is approximately equivalent to data directly sampled from a signal phase shifted by $\phi$.

Thus, it can be seen that for the embodiment of FIG. 1 the estimated, phase shifted, sample value $\hat{r}_n{}'$ can be determined from the following equation:

$$\hat{r}_n{}' = r_n \cos \phi + w_1(r_{n+1} - r_{n-1}) \sin \phi$$

where:

$r_n$, $r_{n+1}$ and $r_{n-1}$ have been previously defined.

$\phi$ = the desired angle of phase shift which can be between 0 and $2\pi$ degrees.

k = is always an odd number which corresponds to the number of shift register stages before and after the center stage in the shift register. In FIG. 1, k=1. Note: The larger the value of k, the higher the accuracy in the calculated value of $\hat{r}_n{}'$.

w = a weight that is determined by the value of k. Calculated exemplary values of $w_k$ for associated values of k are shown in the following table.

| k | $w_k$ |
|---|---|
| 1 | 0.6156 |
| 2 | negligible (e.g., $-2.7 \times 10^{-12}$) |
| 3 | 0.1563 |
| 4 | negligible |
| 5 | $5.1587 \times 10^{-2}$ |

Figure 2:
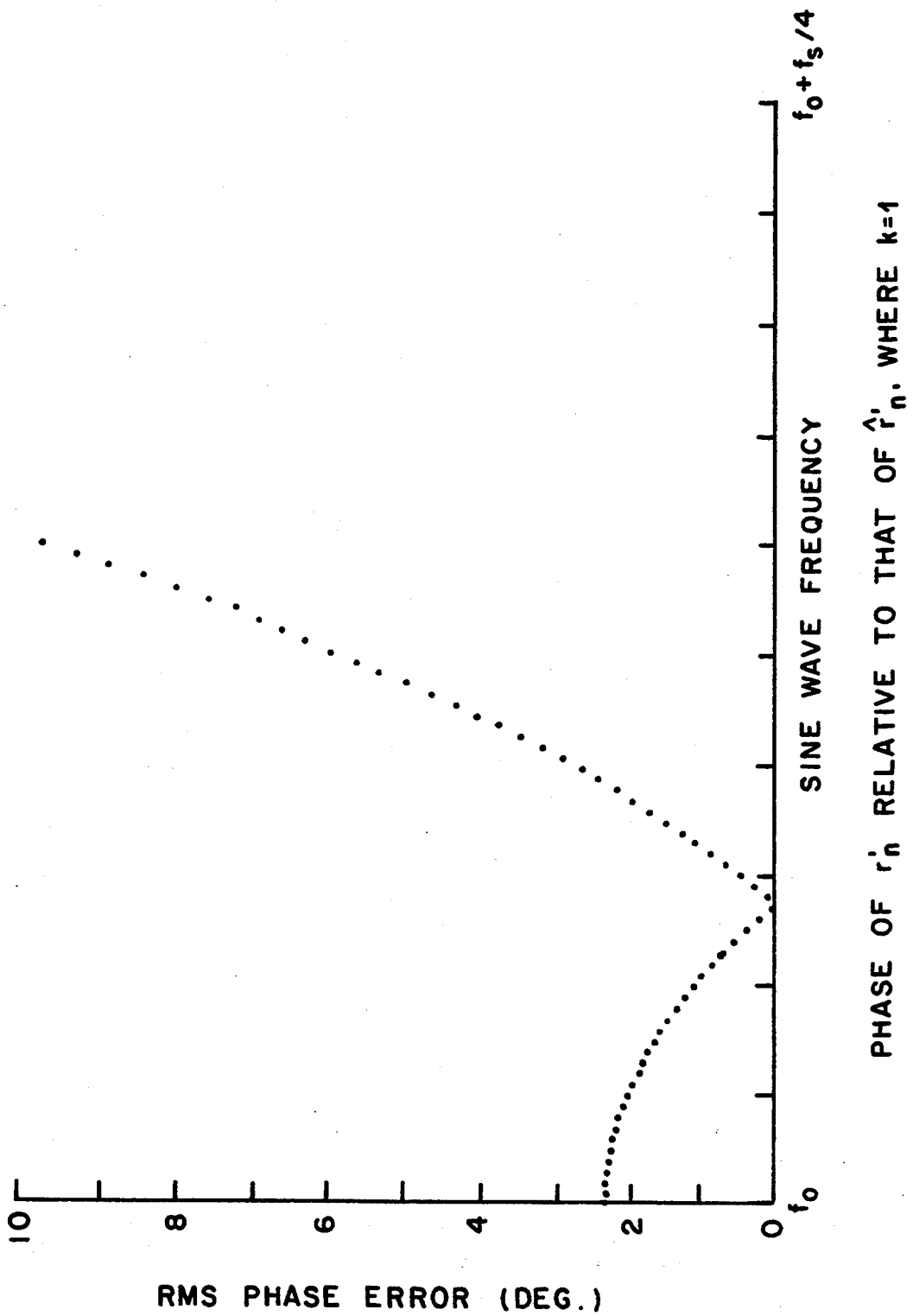
FIG. 2 illustrates the phase of the exact value of $r_n'$ relative to that of the estimated value of $\hat{r}_n'$, where k=1.

FIG. 2 illustrates the phase of the exact value of $r_n{}'$ relative to that of the estimated value of $\hat{r}_n{}'$ for the embodiment of FIG. 1, where k=1. In other words, FIG. 2 shows the phase error that would result from forming the estimated, phase shifted, sample value $\hat{r}_n{}'$ as a function of frequency, where the phase error is the difference between the estimated phase shift of $\hat{r}_n{}'$ and the exact phase shift of $r_n{}'$. That is, if $f_0$ is the center frequency of the bandpass signal r(t), then the left hand end of the abscissa would be $f_0$, while the right hand end of the abscissa would be $f_0 + f_s/4$, where $f_s$ is the sampling rate of the clock generator 13. The ordinate axis represents the phase error in degrees. The curve of FIG. 2 shows that the phase error is less than about 2.3 degrees until just before the fourth division is reached along the abscissa. After the curve reaches that fourth division, the phase error begins to sharply increase. Thus, this curve of FIG. 2 indicates the bandwidth of the system that would use the phase shifter of FIG. 1.

The maximum bandwith of the system that would use the phase shifter of FIG. 1 would depend on the phase error that can be tolerated.

Figure 3:
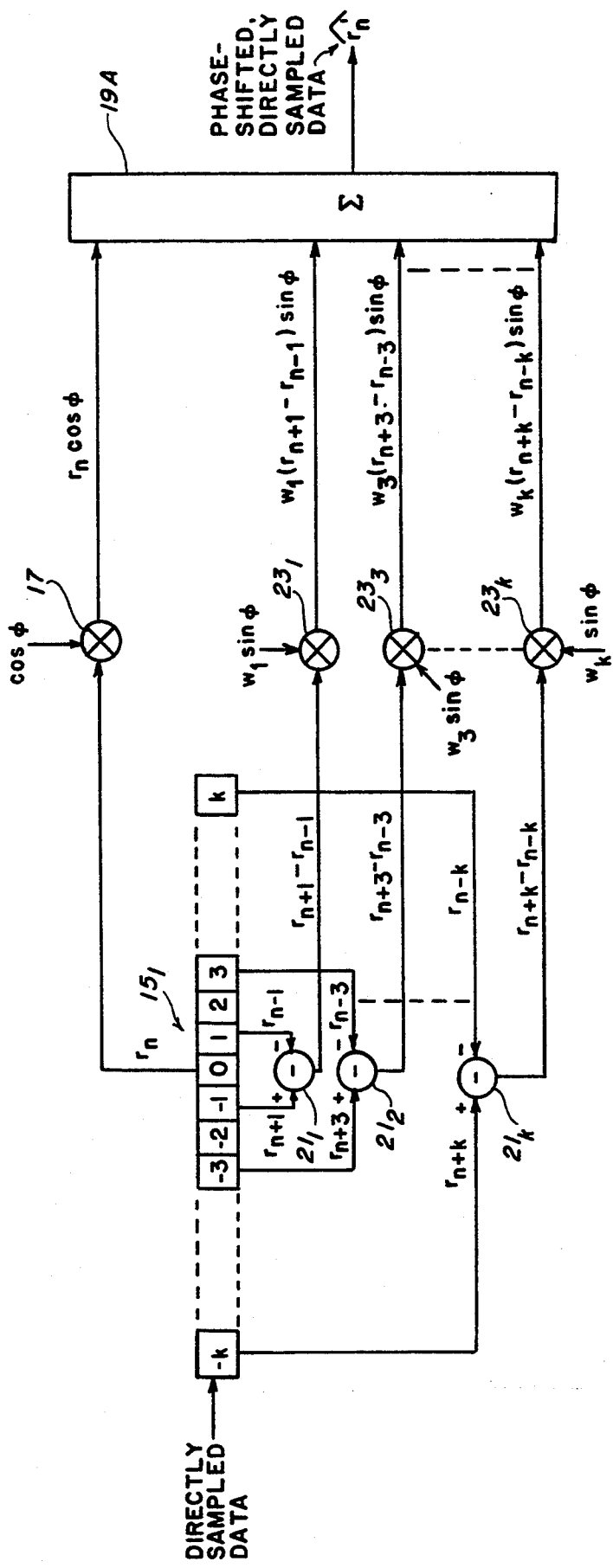
FIG. 3 illustrates an embodiment of the invention for any odd value of k.

FIG. 3 illustrates an embodiment of the invention for any odd value of k. In general, a phase shifter for directly sampled data may be implemented as shown in FIG. 3 for values of k greater than 1. As stated above, k takes on only odd values, and corresponds to the number of shift register stages before and after the center stage in the shift register.

As shown in FIG. 3, the shift register $15_1$ is 2k+1 stages long, having a center stage 0, stages $-1$ up to $-k$ before the center stage 0 in the register $15_1$, and stages 1 up to k after the center stage 0 in the register $15_1$ for storing 2k+1 data samples. The shift register $15_1$, each of the subtractors or combiners $21_1$ and $21_2$ to $21_k$, the multiplier 17, each of the multipliers $23_1$ and $23_2$ to $23_k$, and the summer or adder 19A are respectively similar in structure and function to the elements 15, 21, 17, 23 and 19 shown in FIG. 1 and, hence, require no further description.

If k=1 in FIG. 3, the circuitry and operation of FIG. 3 will be identical to those of the previously discussed embodiment of FIG. 1.

If k=3 in FIG. 3, the $r_{n+1}$ and $r_{n-1}$ outputs from the respective $-1$ and 1 stages of the shift register $15_1$ will be subtracted from each other in the subtractor $21_1$. Then the subtractor $21_1$ and multiplier $23_1$ will operate to develop and apply the product signal $w_1(r_{n+1} - r_{n-1})\sin \phi$ to the summer 19A in a manner identical to that described in FIG. 1. At the same time the $r_{n+3}$ and $r_{n-3}$ outputs from the respective $-3$ and 3 stages of the shift register $15_1$ will be subtracted from each other in the subtractor $21_2$. Then the subtractor $21_2$ and multiplier $23_2$ will operate to develop and apply a product signal $w_3(r_{n+3} - r_{n-3})\sin \phi$ to the summer 19A in a manner similar to that described in FIG. 1. The two product signals from the multipliers $23_1$ and $23_2$ and the $r_n \cos \phi$ weight from the multiplier 17 will then be summed together in the summer 19A to develop a more accurate, estimated, phase shifted, sampled data $\hat{r}_n{}'$ than that developed in FIG. 1, because k has a higher value of k=3 in FIG. 3 than it did in FIG. 1 where k=1.

The operation with still higher values of k in FIG. 3 will be similar to that described above and will produce even a still more accurate estimated, phase shifted, sampled data $\hat{r}_n{}'$, as discussed before.

Figure 4:
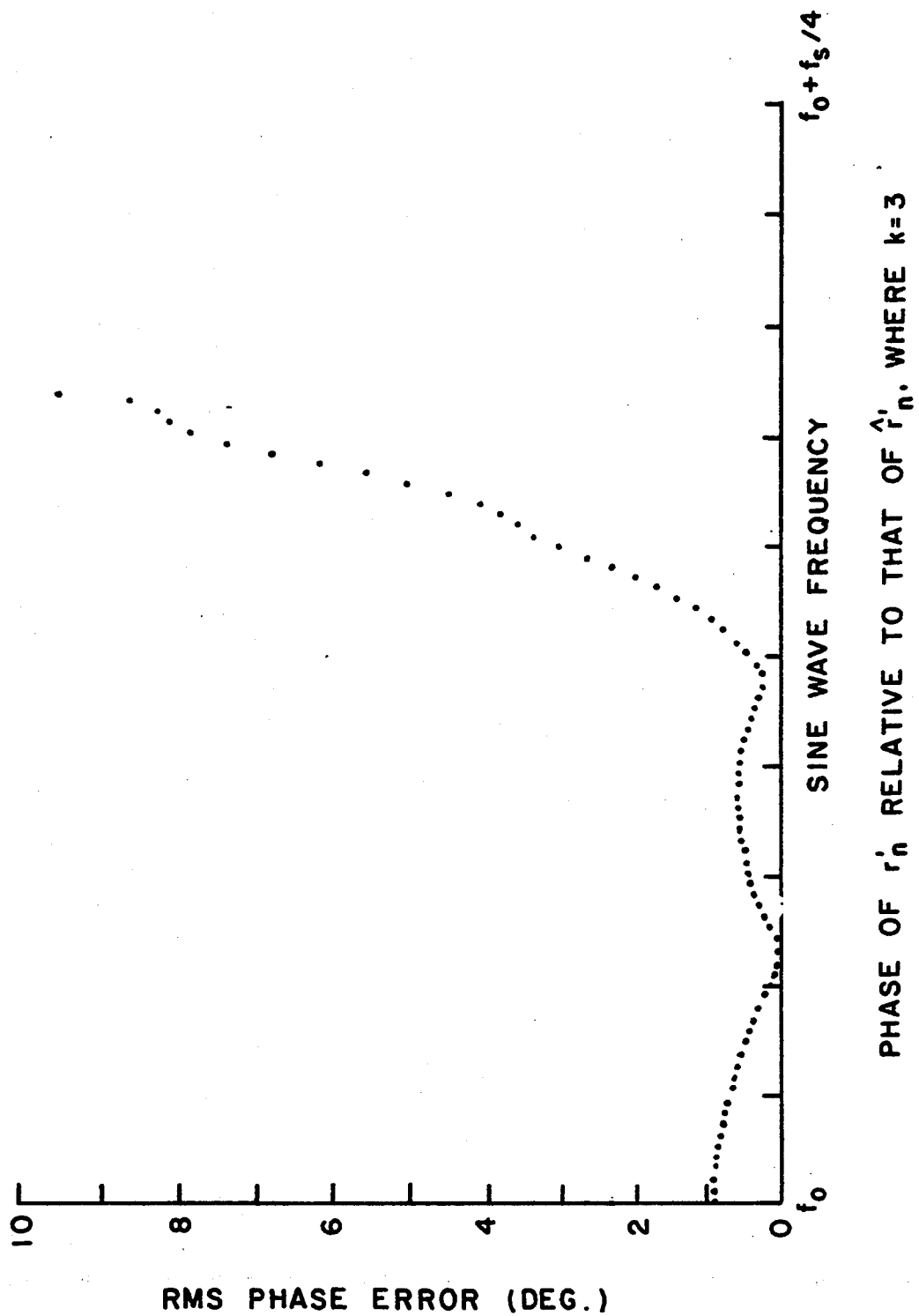
FIG. 4 illustrates the phase of the exact value of $r_n'$ relative to that of the estimated value of $\hat{r}_n'$, where k=3.

FIG. 4 illustrates the phase of the exact value of $r_n{}'$ relative to that of the estimated value of $\hat{r}_n{}'$ for the embodiment of FIG. 3, where k=3. The curve of FIG. 4 shows that the phase error is less than 1.0 degree until just after the fifth division is reached along the abscissa. After the curve reaches that fifth division, the phase error begins to increase. Thus the curve of FIG. 4 shows a much more accurate estimated, phase shifted, sampled data $\hat{r}_n{}'$ than the curve of FIG. 2.

Figure 5:
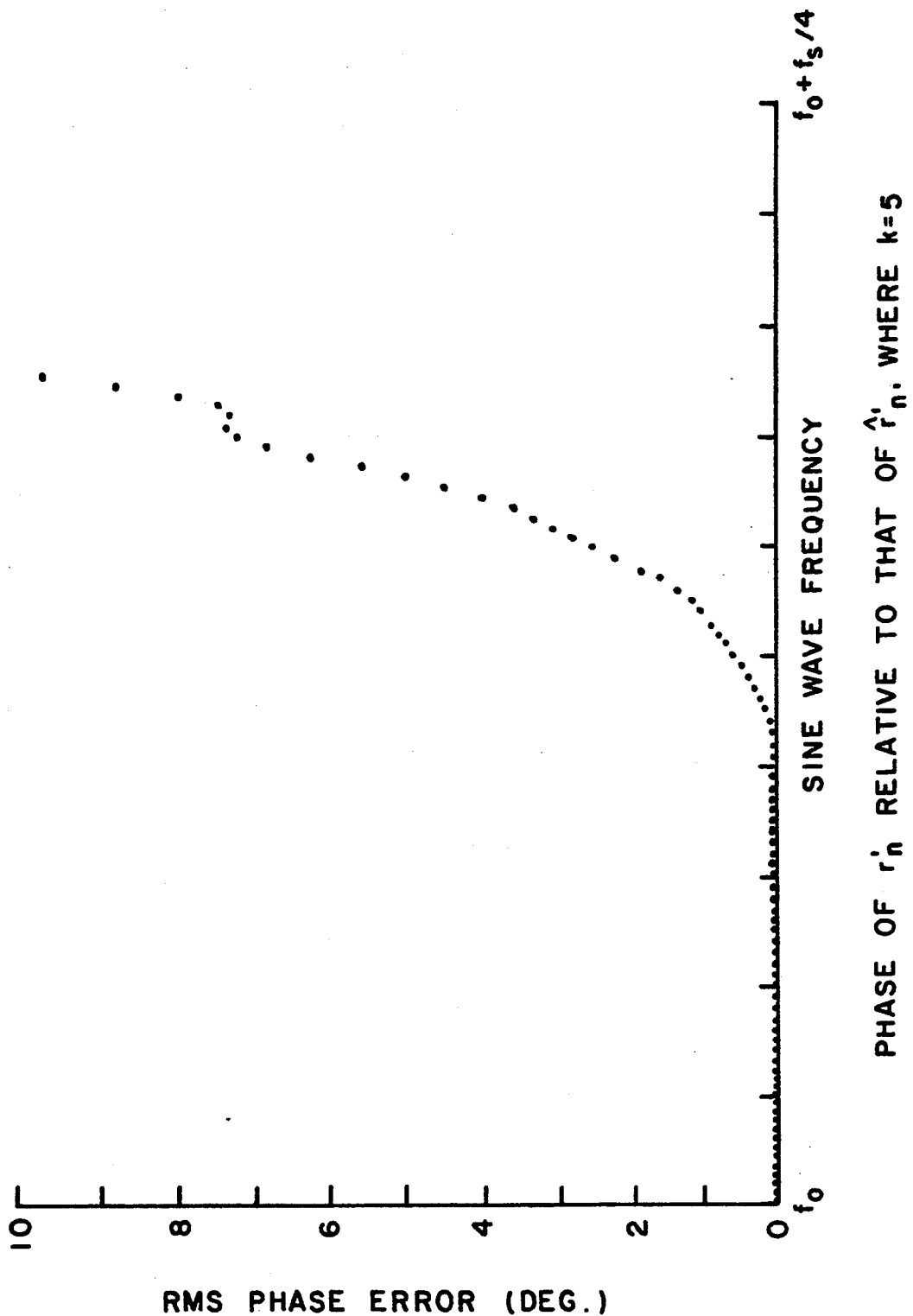
FIG. 5 illustrates the phase of the exact value of $r_n'$ relative to that of the estimated value of $\hat{r}_n'$, where k=5.

FIG. 5 illustrates the phase of the exact value of $r_n{}'$, relative to that of the estimated value of $\hat{r}_n{}'$, where k=5. The curve of FIG. 5 shows that the phase error is flat at 0 degrees until just after the fourth division along the abscissa. after that the curve rises more slowly than the curve of FIG. 4, where k=3. Thus the curve of FIG. 5 shows a much more accurate estimated, phase shifted, sampled data $\hat{r}_n{}'$ than the curve of FIG. 4.

Figure 6:
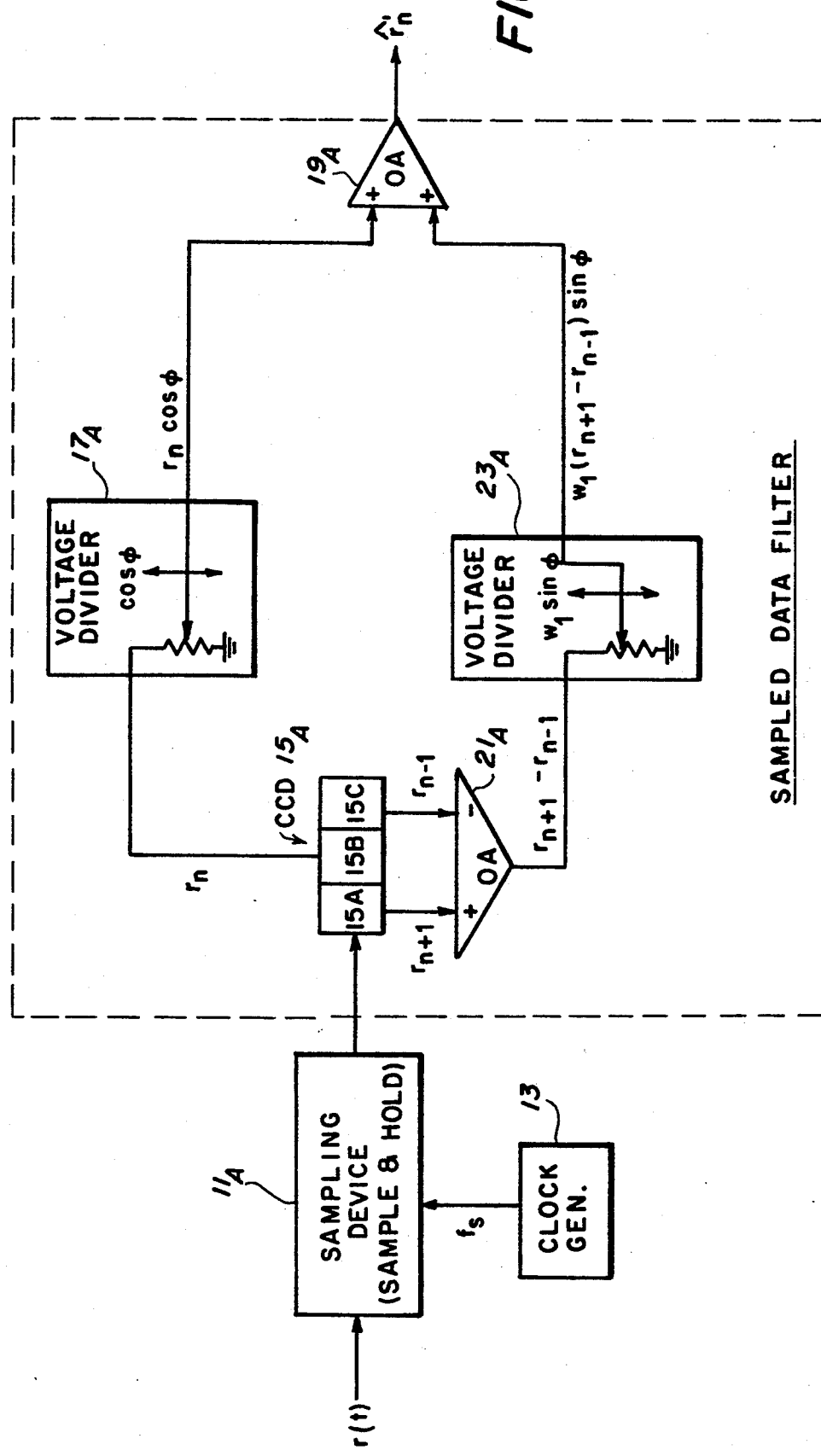
FIG. 6 illustrates an analog implementation of the digital implementation of the first embodiment shown in FIG. 1.

FIG. 6 illustrates an analog implementation of the digital first embodiment of the invention shown in FIG. 1. In the implementation of FIG. 6, a sample and hold sampling device $11_A$, a charge coupled device or CCD array $15_A$, voltage dividers $17_A$ and $23_A$, and operational amplifiers $21_A$ and $19_A$ respectively replace the A/D converter sampling device 11, the shift register 15, the multipliers 17 and 23, and the subtractor 21 and adder 19 of FIG. 1 to form in FIG. 6 the analog implementation of the digital first embodiment shown in FIG. 1. The analog operation of the analog implementation shown in FIG. 6 is fundamentally the same as the previously described digital operation of the digital embodiment of FIG. 1 and, hence, requires no further description.

Therefore, what has been described in a preferred embodiment of the invention is a phase shifter comprised of a digital filter for shifting the phase of directly sampled bandpass signals without having to convert to complex (I,Q) form. In the operation of the digital filter, a sequence of directly sampled digital data is passed into an shift register having an odd number of stages. In one exemplary embodiment, as shown in FIG. 1, the shift register has three stages to sequentially store $r_{n+1}$, $r_n$ and $r_{n-1}$ data samples. The $r_n$ sample is multiplied by $\cos \phi$ to develop an $r_n \cos \phi$ signal, where $\phi$ is the desired phase shift angle. At the same time, the $r_{n+1}$ and $r_{n-1}$ data samples are subtracted from each other and the result is multiplied by $w_1 \sin \phi$ to develop the value $w_1(r_{n+1}-r_{n-1})\sin \phi$. This value is added to $r_n \cos \phi$ to produce an estimated sample value $r_n'$, which is approximately equivalent to data directly sampled from a signal phase-shifted by $\phi$. In addition, an analog implementation of the digital embodiment of FIG. 1 is shown in FIG. 6 in which analog components are substituted for the digital components shown in FIG. 1.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. A digital phase shift system for shifting the phase of directly sampled bandpass signals without having to convert the directly sampled bandpass signals into a complex (I,Q) form, said digital phase shifter system comprising:
   sampling means responsive to a bandpass signal from a signal source for providing a sequence of digital data samples;
   means for sequentially storing $r_{n+1}$, $r_n$ and $r_{n-1}$ digital data samples;
   first means for combining the $r_n$ data sample with a $\cos \phi$ signal to develop an $r_n \cos \phi$ signal, where $\phi$ is the desired phase shift angle at the $r_{n+1}$ sampling time;
   second means for combining the $r_{n+1}$ and $r_{n-1}$ digital data samples to develop an $r_{n+1}-r_{n-1}$ signal;
   third means for combining the $r_{n+1}-r_{n-1}$ signal with a weighted signal of $w_1 \sin \phi$ to develop a $w_1(r_{n+1}-r_{n-1})\sin \phi$ signal, where $w_1$ is a weighted signal and $\phi$ is the desired phase shift angle at the $r_{n+1}$ sampling time; and
   fourth means for combining the output $r_n \cos \phi$ signal with the $w_1(r_{n+1}-r_{n-1})\sin \phi$ signal to produce an estimated sample value $\hat{r}_n'$ which is equivalent to data directly sampled from a phase-shifted signal.

2. The digital phase shift system of claim 1 wherein said sampling means comprises:
   a clock generator for developing a sequence of sampling pulses; and
   an analog-to-digital converter responsive to sampling pulses from said clock generator for converting an input analog bandpass signal from a signal source into the sequence of digital data samples.

3. The digital phase shift system of claim 2 wherein said storing means comprises:
   a three-stage long shift register.

4. The digital phase shift system of claim 3 wherein:
   said first means is a multiplier for multiplying the $r_n$ sample by the $\cos \phi$ signal to develop the output $r_n \cos \phi$ signal;
   said second is a subtractor for subtracting the $r_{n-1}$ sample from the $r_{n+1}$ sample to develop the output $r_{n+1}-r_{n-1}$ signal;
   said third means is a multiplier for multiplying the $r_{n+1}-r_{n-1}$ signal by the weighted signal $w_1 \sin \phi$ to develop the $w_1(r_{n+1}-r_{n-1})\sin \phi$ signal; and
   said fourth means is an adder for adding the output $r_n \cos \phi$ signal and the $w_1(r_{n+1}-r_{n-1})\sin \phi$ signal to produce a new estimated sample value $r_n'$ at each new sampling time.

5. A phase shifter system for shifting the phase of directly sampled bandpass signals without having to convert the directly sampled bandpass signals into a complex (I,Q) form, said phase shifter system comprising:
   means for sampling a bandpass signal to produce a sequence of $r_{n+1}$ data samples;
   means for sequentially storing $r_{n+1}$, $r_n$ and $r_{n-1}$ data samples;
   first means for combining the $r_n$ data sample with a $\cos \phi$ signal to develop a $r_n \cos \phi$ signal, where $\phi$ is the desired phase shift angle at the $r_n$ sampling time;
   second means for combining the $r_{n+1}$ and $r_{n-1}$ data samples to develop an $r_{n+1}-r_{n-1}$ signal;
   third means for combining the $r_{n+1}-r_{n-1}$ signal with a $w_1 \sin \phi$ signal to develop a $w_1(r_{n+1}-r_{n-1})\sin \phi$ signal, where $w_1$ is a weighted signal and $\phi$ is the desired phase shift angle at the $r_{n+1}$ sampling time; and
   fourth means for combining the $r_n \cos \phi$ signal with the $w_1(r_{n+1}-r_{n-1})\sin \phi$ signal to produce an estimated sample value $\hat{r}_n'$ which is equivalent to data directly sampled from a phase-shifted signal.

6. The phase shifter system of claim 5 wherein said sampling means comprises:
   a sample and hold circuit for converting an input analog bandpass signal into the sequence of analog data samples.

7. The phase shifter system of claim 6 wherein said storing means comprises:
   a charge coupled device for sequentially storing the $r_{n+1}$, $r_n$ and $r_{n-1}$ analog data samples.

8. The phase shifter system of claim 7 wherein:
   said first combining means is a first voltage divider for multiplying the $r_n$ sample by the $\cos \phi$ signal to develop an analog $r_n \cos \phi$ signal;
   said second combining means is a first operational amplifier for subtracting the $r_{n-1}$ sample from the $r_{n+1}$ sample to develop an analog $r_{n+1}-r_{n-1}$ signal;
   said third combining means is a second voltage divider for multiplying the $r_{n+1}-r_{n-1}$ signal by the weighted signal $w_1 \sin \phi$ to develop an analog $w_1(r_{n+1}-r_{n-1})\sin \phi$ signal; and
   said fourth combining means is a second operational amplifier for adding the output $r_n \cos \phi$ signal and the $w_1(r_{n+}-r_{n-1})\sin \phi$ signal to produce a new estimated analog sample value $\hat{r}_n'$ at each new sampling time.

* * * * *